United States Patent [19]

Maxfield et al.

[11] Patent Number: 4,879,270

[45] Date of Patent: Nov. 7, 1989

[54] METHOD OF FORMING SUPERCONDUCTING CERAMICS BY ELECTRODEPOSITION

[75] Inventors: MacRae Maxfield, Plainfield; Ray H. Baughman, Morris Plains; Zafar Iqbal, Morristown; Helmut Eckhardt, Madison, all of N.J.

[73] Assignee: Allied-Signal Inc., Morris Township, Morris County, N.J.

[21] Appl. No.: 188,772

[22] Filed: Apr. 29, 1988

[51] Int. Cl.$^4$ .................. H01L 39/00; C25D 5/02
[52] U.S. Cl. .................................. 505/1; 204/15; 204/28; 204/DIG. 11; 204/37.1; 204/25; 505/815; 505/818; 505/821
[58] Field of Search ............ 204/15, 25, 26, 27, 204/28, 37.1, 58.5, 71, DIG. 11; 505/815, 818, 813, 821

[56] References Cited

PUBLICATIONS

D. J. Zurawski et al, *J. Electrochem. Soc.*, Jun. 1988, pp. 1607–1608.
C&EN, Oct. 29, 1979, p. 7.
R. J. von Gutfeld et al, *App. Phys. Lett.* vol. 35, pp. 651–653 (1979).

*Primary Examiner*—Aaron Weisstuch
*Attorney, Agent, or Firm*—Gerhard H. Fuchs

[57] ABSTRACT

The invention relates to an improvement in a method of forming deposits of superconducting ceramics. Generally, such ceramics are formed by electrodepositing a mixture of metals of the type, and in proportions sufficient to be oxidized into ceramic, onto a substrate. The electrodeposited mixture is then oxidized under conditions sufficient to result in a super conducting ceramic deposit. The improvement resides in conducting the electrodeposition in a manner which results in a patterned electrodeposition prior to conducting oxidation.

10 Claims, 4 Drawing Sheets

FIG. 2  EuBa$_2$Cu$_3$O$_x$  Film on Pt

METHOD OF FORMING SUPERCONDUCTING CERAMICS BY ELECTRODEPOSITION

CROSS-REFERENCE TO RELATED APPLICATIONS

This application is related to commonly assigned U.S. Appl. Ser. No. 188,019 filed on even date herewith by the same inventors for "Method of Forming Superconducting Ceramics by Electrodeposition and Thin Superconducting Ceramic Made Thereby".

BACKGROUND OF THE INVENTION

This invention relates to a method of forming films, thin films or other like deposits of superconducting ceramics and the superconducting ceramic films made by the method. More particularly, the method is directed to the electrodeposition of a mixture of metals of the type and in a proportion sufficient to be oxidized into a superconducting ceramic, with the subsequent step of, after electrodeposition of the mixture of metals, oxidizing the electrodeposited mixture of metals to form the superconducting ceramic film.

Superconducting materials, as discussed in copending application Ser. Nos. 052,830, filed in May, 1987, and 097,994, filed Sept. 17, 1987, both of which are commonly assigned, have been known since 1911. However, the synthesis of superconductors having relatively high transition temperatures above 30° K. is a quite recent development. By superconductors we herein mean such high transition temperature superconductors.

One class of these materials has been found to be superconducting near 90° K. and has been identified as an oxygen deficient perovskite corresponding to the general composition $MBa_2Cu_3O_y$ (referred to hereinafter as the 1-2-3 material), where M is La, Y, Sm, Eu, Gd, Tb, Dy, Ho, Er, Tm, Yb, Lu or Th or combinations of these elements. Two sub-classes of the 1-2-3 materials are: (a) an oxygen-reduced form, with an oxygen content of about 6.7 atoms per unit cell, which has a transition temperature (Tc) of about 60 K., and (b) a doped form referred to sometimes as the 3-3-6 structure of general formula $M(Ba_{2-x}M_x)Cu_3O_{7+\delta}$ in which M=Y, La, Sm, Eu, Gd, Tb, Dy, Ho, Er, Tm, Yb, Lu or Th, where Tc ranges from 0 to about 60 K. depending on x and annealing conditions. A second independent class with a Tc of between 20 and 40 K. consists of perovskite materials of composition corresponding to $La_{2-x}M_xCuO_4$, where M is Sr, Ba or Ca. These materials have been characterized by a variety of techniques (Extended Abstracts of the Materials Research Society Spring Meeting, Anaheim, Calif., 1987 and "High Temperature Superconductors", Materials Research Society Symposium Proceedings, Vol. 99 (1988)). More recently Bi and Tl containing compositions and phases such as $Bi_2Sr_2Ca_1Cu_2O_8$ and $Tl_2Ba_2Ca_1Cu_2O_8$, superconducting near 110 K. and a $Tl_2Ba_2Ca_2Cu_3O_{10}$ phase superconducting near 127 K., (Proceedings of Conference on Materials and Mechanisms of High Tc Superconductivity, Interlaken, Switzerland, 1988, to be published in Physica B.) have been identifed.

Thus, as can be seen, a lot of work has been done in superconductors, but up to now, no effective way of putting such high temperature superconducting compositions to use in, for example, circuit or superconducting wire applications, have been developed.

More particularly, prior art methods of manufacturing superconducting compositions involved mixing together amounts of compounds having the desired metals in ratios as they are found in superconducting compounds, and treating the materials in a complex series of steps which ultimately involve firing in an oven to oxidize the metals into a ceramic composition which is superconducting (Extended Abstracts of the Materials Research Society Symposium, Anaheim, Calif., 1987). The resultant materials are typically powder in form and, thus, are not easily used.

Other methods of making the superconducting ceramics involve, for example, (i) the firing under oxygen of a metal mixture formed by molten metal processing and (ii) the solution deposition of an organometallic precursor followed by a firing step under oxygen ("High Temperature Superconductors", Materials Research Society, Symposium Proceedings, Vol. 99 (1988)).

One prior art alternative approach to developing materials, such as the 1-2-3 phase in a useable form has involved chemical vapor deposition of the metals. For example, in the case of the 1-2-3 composition, the metals are deposited by chemical vapor deposition, and thereafter oxidized into a ceramic film. This technique however, is complicated, and precision deposition of the film on desired areas or on desired paths has not yet been achieved. Moreover, the technique itself is complicated, requiring high vacuum, high deposition temperatures, as well as requiring very high temperatures to fire the metals in an oxygen atmosphere to oxidize and then form the ceramic film ("Thin Film Processing and Characterization of High Temperature Superconductors", No. 165, American Vacuum Society Series, editors J. M. E. Harper, R. J. Colton and L. C. Feldman, 1988). The former complications are avoided by the method of the invention.

The application of electrochemical techniques to the formation of high temperature superconductors has been restricted to a method of electrochemically varying the oxygen content of certain high temperature superconductors, ("High Temperature Superconductors", Materials Research Society, Symposium Proceedings, Vol. 99 (1988)). No known prior art exists for electrochemically forming combinations of metals that are precursors to high temperature superconductors. In addition, no known precedent exists for the electrochemical formation of combinations of metals similar to those found in high temperature superconductors.

In particular, there is no known precedent for the codeposition of metals whose deposition potentials differ by about 3V and, therefore, whose deposition rates and characteristics can be expected to differ dramatically.

Those of ordinary skill in this art would not codeposit such combinations of metals by conventional electrodeposition methods because such combinations comprise one or more metals whose deposition from an electrolyte requires application of a highly cathodic potential (i.e., highly reducing potential). Aqueous electrolytes, used in conventional electrodeposition, are, themselves, reactive with materials having such highly cathodic reduction potentials at these potentials. Thus, those of ordinary skill in this art would expect that such metals having highly negative reduction potentials would not be effectively deposited on the substrate. By cathodic potential is meant a potential which allows electrons to be liberated, e.g., from an electrode to reduce the charge of a species in an electrolyte. By highly reducing potential is meant that which is substantially negative of the potential at which $H^+$ is reduced to $\frac{1}{2} H_2$ as at a normal hydrogen electrode (NHE). For example, each known precursor combination includes one or more metals that can be deposited only at potentials more than 2V cathodic (negative) of NHE (e.g., $Ca^{+2}$ at potentials $< -2.76V$ vs normal hydrogen electrode, $Sr^{+2}$ at $< -2.89V$, $Ba^{+2}$ at $< -2.90V$, $Y^{+3}$ at $< -2.37V$). For comparison, copper, which is typically also required for formation of the high transition temperature superconductors, has a much more positive reduction potential for $Cu^{+2}$ of $+0.34$ eV.

SUMMARY OF THE INVENTION

In accordance with the general aspects of the invention, a method of forming a deposit, e.g., thin films, of superconducting material, i.e., ceramic, is provided which essentially modifies electrodeposition techniques into a simple two-step method which results in an easily achieved deposit, e.g., thin film, of superconducting ceramic. Like conventional electrodeposition, the method of this invention provides a means for forming coatings, by batch or continuous processes, on the surfaces of irregular objects including interior surfaces, wires, and patterned substrates. Such coatings of superconducting materials, which cannot be conveniently obtained by alternative technologies, are of interest for a variety of applications such as superconducting electrical lines, superconducting bearings, and superconducting wire windings for magnets, transformers, and generators. The present invention is believed to be advantageous for the formation of superconducting devices, such as SQUID's and Josephson junctions, due to the feasibility of generating superconducting coatings in micropatterned forms.

The electrodeposition step preferably consists of applying a reducing potential to a conductive substrate while it is in contact with an appropriate electrolyte into which are also immersed a counter-electrode and, in some cases, other auxiliary electrodes.

In particular, the electrodeposition can be conducted from an electrolyte containing salts of all of the metals in the mixture of metals to be deposited. Alternately, one or more of these metals can be included in the composition of a counterelectrode. Metals deposited from the electrolyte may include, but are not restricted to M=La, Y, Sm, Eu, Gd, Tb, Dy, Ho, Er, Tm, Yb, Lu, Th, Ba, Bi, Tl, Sr, Ca, and Cu in combination and quantities sufficient to form superconducting ceramics by oxidation. The preferred specific metals and specific proportions of these metals in the superconducting oxides are well described in the prior art (Extended Abstracts of the Materials Research Society Spring Meeting in Anaheim, Calif., 1987). Of course, other metals which functionally behave in the same manner can be substituted for the above as will be readily apparent to those of ordinary skill in this art. In addition, other elements, which do not comprise part of a superconducting ceramic, may be codeposited for the purpose of imparting enhanced mechanical properties. Preferred metal compositions for electrochemical deposition and reaction to form the superconducting phase are those which are miscible, since miscibility enhances the homogeneity of the superconductor product. Whether or not miscibility exists is either known or readily determined for the metal system of interest here. Preferred elements for imparting improved mechanical properties are metals, such as silver, which do not substantially oxidize during formation of the superconductor.

Exemplary of salts that may be included in the electrolyte are: $(Y(NO_3)_3$, $Ba(PF_6)_2$, and $Cu(OCOCH_3)_2$. The electrolyte medium containing the salts may be an aprotic liquid, i.e., a liquid containing minimal acidic protons, such as dimethylsulfoxide (DMSO), dimethylformamide (DMF), dimethoxyethane (DME), tetrahydrofuran (THF), and the like. Such electrolyte media may contain, in addition, wetting, complexing, or other agents that impart control over composition or morphology of the deposit. Some water may also be included in the electrolyte solution in order to achieve in some instances the desired conductivity and solubility of the given salt. The water content would not be allowed to exceed that which would be coordinated with the dissolved ions. Such liquids with minimal or no water area referred to as aprotic liquids. In addition, the electrolyte medium may be an ion-conducting conducting polymer, such as salt-containing polyethylene oxide, or a fused salt or fused salt mixture.

The potential applied to the substrate should be sufficient to reduce cations of each salt in the electrolyte to its neutral oxidation state. It should, therefore, be sufficiently cathodic (i.e., at a suitably reducing potential) to reduce the cation having the most negative reduction potential of the mixture. For example, codeposition from an electrolyte containing salts of Eu, Ba, and Cu, requires the application of potential $< -2.89V$ versus normal hydrogen electrode in order to reduce $Ba(+2)$ to $Ba(0)$ (standard reduction potential $-2.89V$) as well as $Cu(+2)$ to $Cu(0)$ ($+0.34V$), and $Eu(+3)$ to $Eu(0)$ ($-2.37V$). The applied potential may be varied with time, pulsed, or periodically reversed in order to regulate deposition current, electrolyte composition, and deposit nucleation.

According to the method of this invention, the mixture of metals is electrodeposited onto a substrate which is electrically conductive and not harmful to the resultant ceramic. Electrode substrate materials may be metallic, semiconductive, or photoconductive. They may be free standing such as conductive plates, rods, wires, fibers, and foils, or supported by structural material such as conductive thin films of metals, conductive oxides, and semiconductors coated on quartz and ceramics. The electrode substrates may be virtually any size, shape, and number as long as the electrolyte in contact with the surfaces to be coated is also in contact with a counter electrode. The electrode substrate can consist of or include a metal or metal containing composition which reacts with the electrodeposited metal during oxidation to form the superconductor. For some applications it is desirable to utilize the electrode substrate as the sole source of one of the metals required for formation of the superconductor. This requires interdiffusion of substrate and deposited metals. For purposes of such interdiffusion, post-deposition thermal annealing is useful. A preferred example is electrodeposition of all the metals in the superconductor except for copper onto a low denier copper wire or thin copper foil. Oxidation of the substrate containing electrodeposited metals then yields the superconductor in wire or foil form. For the purpose of obtaining oriented growth of the superconductor phase, and thereby obtaining enhanced critical currents, substrate electrode geometries which provide preferential crystal growth directions can be used. One such convenient substrate electrode geometry is obtained by grooving the electrode surface with parallel lines. The substrate material can also be chosen as one which will disappear via sublimation or gasification under the oxidation conditions, so as to result in a substrate-free superconductor.

The counter electrode and other auxiliary electrodes useful in this method are electrically conductive solids such as metals, semiconductors, and photoconductors. They may be inert or electroactive under the conditions of electrodeposition. Those that are electroactive may be useful as sources to the electrolyte of cations of metals being deposited. Counter electrodes with high electrical conductivities (above 100 S/cm) are preferred in order to minimize resistive energy losses during electroplating.

The electrodeposition of the metal mixtures may be performed in seconds to several hours, depending on the deposition current which may range from about $10^{-3}$ to about $10^{+3}$ mA/cm$^2$ of substrate area. The preferred current for deposition from aprotic liquid electrolytes is from about $10^{-2}$ to about 10 mA/cm$^2$. The film thicknesses may range from about $10^{-2}$ to about $10^{+3}$ microns or more. The preferred film thicknesses range from about $10^{-1}$ to about 100 microns. Electrodeposition of precursor metal mixtures must be conducted at temperatures wherein the electrolyte is ionically conductive. Electrodeposition in aprotic liquid electrolytes is conducted, generally, at temperatures between about $-40°$ and about $+200°$ C. The preferred temperature range for using aprotic liquid electrolytes is from about 0° to about 100° C. Solid polymer electrolytes are generally useful between about 60° and about 300° C., and fused salt electrolytes are generally useful between about 200° and about 500° C. Due to higher obtainable conductivities, aprotic liquid electrolytes and fused salt electrolytes are preferred over solid polymer electrolytes. Due to convenient operation near room temperature, aprotic liquid electrolytes are most preferred.

The compositions of deposited mixtures are generally dictated by deposition currents of the individual species at a given applied potential, relative salt concentrations in the electrolyte, and total salt concentration. In the case of aprotic liquid electrolytes, applied potentials are configured to those that are sufficient to deposit all desired species but not so highly cathodic as to harm the deposit through decomposition of the electrolyte. Relative deposition currents of the individual species, which may differ greatly for a given mixture, are, therefore, similarly restricted. In addition, total salt concentration is restricted by solubilities in a given electrolyte medium. Adjustments to salt concentrations in the electrolyte are, however, effective in obtaining desired deposit composition. This method, therefore, includes a process for establishing the dependence of deposit composition on relative salt concentrations known to those of ordinary skill in the art. For example, at an applied potential of $-5V$ (vs Ag/Ag$^+$) and a total salt concentration of 0.1M in DMSO, Y-Ba-Cu in the deposit varied according to relative cation concentrations as follows:

| Composite | | | Electrolyte | | |
| --- | --- | --- | --- | --- | --- |
| Y | Ba | Cu | Y$^{+3}$ | Ba$^{+2}$ | Cu$^{+2}$ |
| 1 | 1.1 | 9.7 | 1 | 2 | 1 |
| 1 | 1.4 | 3.1 | 1 | 2 | 0.5 |
| 1 | 1.8 | 3.4 | 1 | 2.8 | 0.5 |

Finally, the invention also relates to a superconducting film on a substrate made in accordance with the method of the invention. Further, although the invention has generally been discussed with respect to the yttrium or europium, barium, copper 1-2-3 composition, it is clear that this electrodeposition technique and later oxidation can be applied to other superconducting compositions such as, for example, that disclosed in copending application Ser. No. 097,994, referred to as the 3-3-6, yttrium, barium, copper composition, and $Tl_2Ba_2Ca_1Cu_2O_x$ and $Tl_2Ba_2Ca_1Cu_3O_x$ compositions.

BRIEF DESCRIPTION OF THE DRAWINGS

Having briefly described the invention, the same will become better understood from the following detailed discussion, taken in conjunction with the drawings wherein.

DETAILED DISCUSSION OF THE INVENTION

Figure 1:
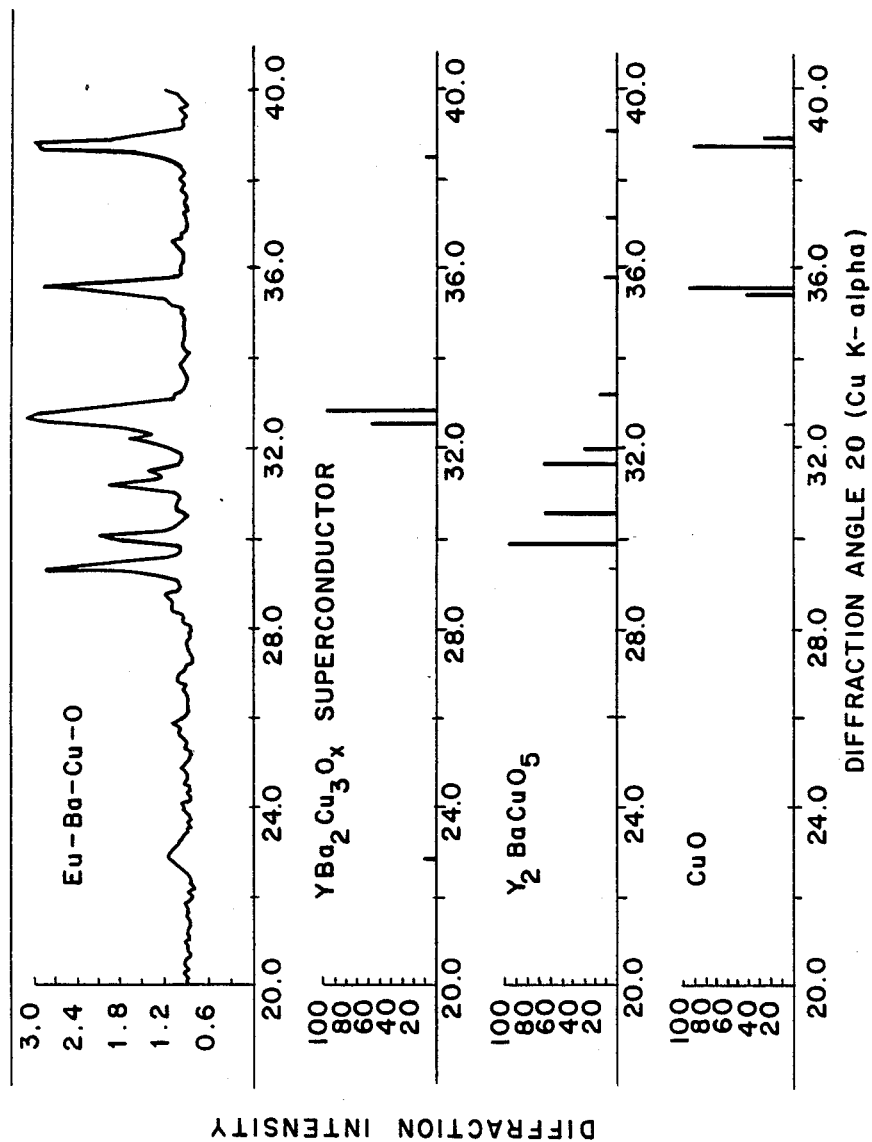
FIG. 1 is a comparison of the X-ray diffraction pattern of a film deposited from a DMSO solution of Eu(NO$_3$)$_3$, Ba(NO$_3$)$_2$ and Ca(OCOCH$_3$) after oxidation thereof (top) with the x-ray diffraction pattern previously established for a superconducting phase of Eu-Ba-Cu-O and two impurity phases (Y$_2$BaCuO$_5$ and CuO)

In accordance with the invention, metal mixtures are electrodeposited onto substrates and oxidized to form films of superconducting ceramics. More particularly, electrodeposition of appropriate metals is performed simultaneously from a single electrolyte. The oxidation is then generally performed by heating the deposited metal mixture in an oxygen-containing atmosphere.

The principal advantage provided by this method is that a facile and versatile technique for incorporating elements into circuits, which can then be converted to a superconducting composition, is provided. The electrochemical technique is performed in a single step requiring neither the high temperatures necessary for metallurgical deposition of the metals nor the high vacuum required for chemical vapor or molecular beam deposition techniques. The selection and number of metals that may be electrodeposited is not restricted by the method, the only consideration being that it must include those metals in a ratio which can be oxidized to form a superconducting ceramic. Thus, the stoichiometry and thickness of the metal deposited is controlled in accordance with conventional electrodeposition methods.

Exemplary of metal mixtures which are formed and subsequently oxidized according to this method are mixtures: Eu or Y, Ba, and Cu in a 1-2-3 ratio; Bi, Sr, Ca, and Cu in a 1-1-1-2 ratio; and Tl, Ca, Ba, and Cu in a 1-1-1-2 ratio.

Typically, the electrodeposition is conducted at room temperature from a liquid electrolyte comprised of salts of the metals dissolved in an aprotic solvent by applying a voltage across the substrate and counter-electrode such that the substrate is held at a constant potential of about $-3$ to about $-6V$ versus a Ag/Ag$^+$ reference electrode. The concentrations of the salts are adjusted to account for the relative deposition rates of the different cation species. For example, Y, Ba, and Cu are deposited in a ratio of 1-2-3 onto an In-Sn oxide film on quartz substrate when a potential of about $-5V$ versus $Ag/Ag^+$ is applied to the substrate immersed in a DMSO solution that is about 0.1M in $Y(NO_3)_3$, about 0.27M in $Ba(NO_3)_2$, and about 0.05M in $Cu(OCOCH_3)_2$. As a second example, Bi, Sr, Ca and Cu are deposited onto a Pt substrate when a like potential is applied to the substrate immersed in a DMSO solution that is about 0.02M in $Bi(NO_3)_3$, about 0.1M in $Sr(NO_3)_2$, about 0.092M in $Ca(NO_3)_2$ and about 0.025M in $Cu(OCOCH_3)_2$. After passage of about 0.1 to about 40 coulombs/cm$^2$ for typical films having thickness of about 0.1 micron to about 40 microns, i.e., 1 micron per coulomb, the substrate with deposited film is removed, rinsed in fresh solvent, and dried.

Since the electrodeposition process can function as a purification step to eliminate undesireable impurities in the metal salts, this present process for forming the superconductors can utilize effectively lower impurity precursors than are possible for alternate fabrication techniques for thin film formation, such as sputtering.

Once it is confirmed that that deposit consists of the metals in question in the preferred yield, the substrate is then heated in an oxidizing atmosphere up to a temperature and time sufficient to oxidize the deposited metals into the superconducting ceramic state. Either prior to or following this oxidation step, it is sometimes desirable to utilize other thermal or chemical treatments known in the art in order to enhance the properties of the superconductor. For example, melting and resolidification of the as-formed superconductor can be employed to provide enhanced critical currents via enhanced preferential alignment of crystallite grains in the superconductor.

Figure 4:
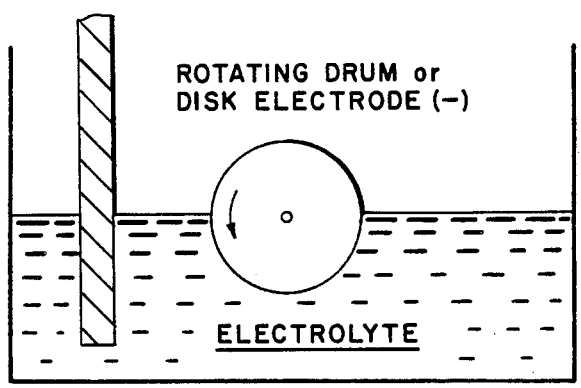
FIG. 4 is a schematic diagram of two continuous electrochemical processes.
Figure 5:
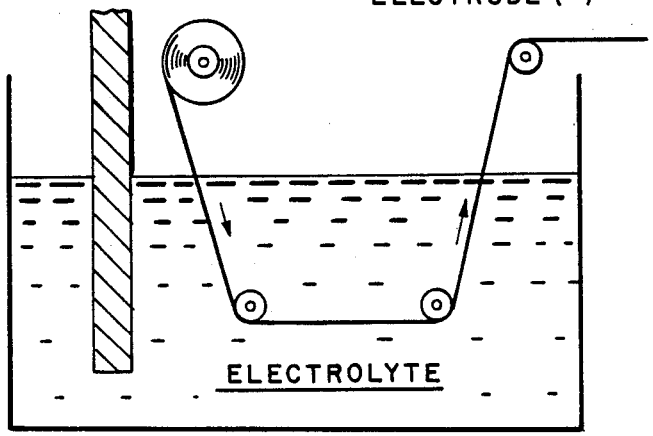

As a refinement, this procedure can be employed in combination with other technologies to produce patterned superconducting films. For example, electrical circuits and other objects containing semiconductors, insulators, or conductor elements with superconducting paths may be formed by this method in combination with conventional lithography or in combination with photoinduced enhancement of electrodeposition. Such combinations can be particularly useful in forming parallel arrays of superconducting wires and dots such as those useful as high efficiency transparent shields of electromagnetic radiation. For applications in which high spatial resolution is not required for the superconductor elements of a circuit or array, patterned superconductor films can arise from electrodeposition using patterned counterelectrodes. As a further refinement, the procedure can be employed in a continuous manner using continuous substrates configured, for example, about a "rotating drum" or rotating belt cathode (see FIG. 4).

Selective area electrochemical deposition of the superconductor precursor alloys can be conveniently accomplished using a modification of the lithography techniques conventionally employed to form circuits of metallic and semiconducting elements. An insulating photoresist is deposited (for example, by solution or gas deposition) on the electrode substrate. In one embodiment, a positive photoresist is made insoluble or nonvolatile as a consequence of selected area irradiation, so the substrate conducting electrode is later revealed (after solvent or thermal treatment) only in those regions of the electrode where the photoresist has not been irradiated. Since only the nonirradiated regions of the electrode are not insulating, only those regions undergo deposition of the alloy upon electroplating. Alternately, the irradiation process can lead to either enhanced solubility or volatilization of the irradiated regions of the photoresist. In the former case, solvent treatment of the irradiated electrode can be used to expose the conductor surface only at irradiated regions of the photoresist. Upon subsequent electroplating, the superconductor precursor alloy forms only on portions of the electrode where the insulating layer of photoresist has been removed.

The metal alloy composition which is precursor to the superconductor can also be electrochemically deposited in a patterned form on an electrode using photoinduced inhancement of electrochemical deposition. For this purpose, the most convenient photon source is a higher energy laser which is scanned across the electrode surface to generate the patterned alloy deposition. Depending upon the selected photon frequency, the electrolyte, and the target electrode surface, the mechanism of the photoenhanced electrochemical deposition varies. For example, relatively low photon fluxes can be used to generate photocarriers in a photoconductor present at the electrode surface. The resulting current flow through the photoconductor then generates the patterned alloy deposition. Alternately, the photon source can provide patterned alloy deposition by selective volume heating of either the electrolyte or the electrode surface, so as to provide increased current flow at points of irradiation. High temperature oxidation and thermal annealing transforms the patterned alloy deposition into a patterned superconductor deposition. Patterned deposition on a photoconductor surface can also result from patterned exposure to penetrating radiation, such as x-rays. Hence, it is possible to generate a patterned deposition of the superconductor on surface areas which are inaccessible to either visible or ultraviolet radiation.

For applications in which high spatial resolution is not required for the patterned formation of superconductor on a substrate, it is possible to utilize an alternate strategy for patterned deposition. Specifically, the use of a patterned counter electrode or patterned motion of a counter electrode (having dimensions much smaller than the pattern desired on the electroplated electrode) can be used for the electroplating of the precursor superconductor alloy. Note also that segmentation of the patterned counter electrode, so as to provide subunits in the pattern which are at different voltages, provides an additional design feature for the patterned electroplating of the precursor superconductor alloy. This effective segmentation can be either by direct electrical separation or by the use of internal resistive elements. Similarly, use of a counter electrode which undergoes voltage changes during patterned motion provides additional flexibility for the electrochemical deposition of a patterned superconductor precursor alloy.

Modification of the above-described photoenhanced electrochemical deposition can be used to conveniently generate parallel superconducting wires having separations comparable with the wavelength of light. The modified approach utilizes the alternating stripes of intense light and near-zero light intensity resulting from the interference of two light beams. This pattern of illumination generates, via selected area photoenhancement of current flow, the patterned deposition of superconductor precursor alloy. Note that oxidation of the thereby obtained precursor alloy wires can provide the additional advantage of oriented growth of the superconductor as a consequence of the shape anisotropy of the precursor alloy. Such oriented growth is preferred for improving the properties of the superconductor, and specifically for increasing the critical amount.

Patterned electrochemical deposition of the superconductor precursor alloy on a transparent electrode substrate, using the above-described methods, permits preparation of an optically transparent superconductor. The patterning, such as an array of parallel strips or a two-dimensional dot array of either the superconducting or the superconductor-free areas, provides for optical transparency. Such transparent films can find applications as windows which have extremely high efficiency for the shielding of radio frequency and microwave frequency radiation. Use of a two-dimensional dot array of superconductor can provide for a film which is superconducting in the film thickness direction and insulating in the plane of the film.

The electrode electroplated with the superconductor precursor alloy can be in the form of a moving belt or wire which passes continuously into the electroplating solution and into close proximity to the counter electrode. (Passage of the wire through the center of a cylindrical counter electrode is preferred in the latter instance.) If desired, the belt (or wire) can then pass from the electroplating solution into a chamber for thermal treatment in an oxygen-containing atmosphere. This thermal treatment in oxygen to provide the high temperature superconductor can employ an oxygen plasma or laser-induced heating. If thick coatings of the superconductor are desired, the belt (or wire) can pass continously between the electroplating bath and the oxidation chamber. Analogously, thick coatings of superconductor can be formed on a drum-shaped article by rotation of a drum-shaped electrode so that electroplating continuously occurs on the side of the drum which is immersed in the electroplating solution. The opposite side of the drum can be continuously laser heated in an oxygen-containing atmosphere to transform the metal alloy into a superconductor. Similarly, electrodeposition can be on a disk shaped counter electrode which is continuously rotated, so as to expose a continuously varying surface of the disk to electroplating process.

The rotating drum method can be employed for the direct fabrication of a spiral-like wind of superconducting and insulating sheets. Upon near completion of a 360° deposition of the superconducting layer, processing conditions can be changed so that near 360° deposition of an insulator is applied. Alternation of the processing conditions which result in the insulator and the superconductor, so as to maintain continuity in the superconductor sheet, results in the winding of the magnet. The changes in processing conditions can correspond to changes in the applied electrochemical potential, changes in the composition of the electrochemical bath, and/or changes in the heat treatment environment, so as to result in the change from formation of superconductor to formation of insulator. Alternately, the insulator layer can be applied by more conventional routes, such as sputtering a layer of insulating oxide.

In contrast with the conventional technology of forming thin films by sputtering, the electrochemical approach is well suited for deposition of the superconductor precursor alloy on complicated shapes and interior surfaces of articles. For example, the precursor alloy to the superconductor can be deposited on the inside surface of a pipe by filling the pipe with electrolyte, centrally located the anode in the pipe, and utilizing the inner surface of the pipe as the cathode for electrochemical deposition. Transformation of the precursor alloy into the superconductor is then conveniently accomplished by heat treatment of the pipe in an oxygen-containing atmosphere.

Having generally described the invention, the following examples are intended to be illustrative but not limiting any manner.

EXAMPLE I

Figure 2:
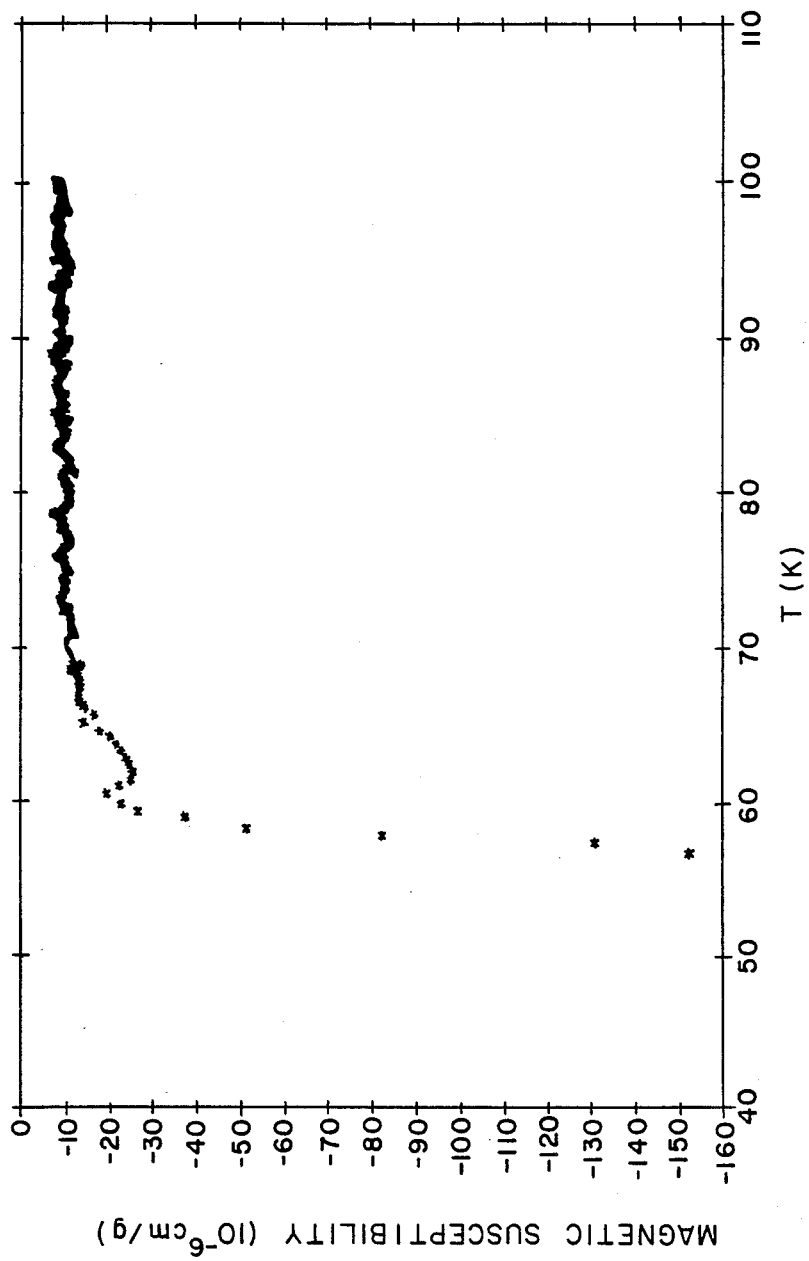
FIG. 2 is a magnetic susceptibility graph as a function of temperature of EuBa$_2$Cu$_3$O$_{7+x}$ formed by oxidation of an electrodeposited mixture of Eu, Ba and Cu.

Europium, barium, and copper were codeposited by electrodeposition onto a platinum foil electrode in a molar ratio of 1-2-3. The platinum foil electrode, a copper counter electrode, and a Ag/Ag$^+$ reference electrode were immersed in a dimethylsulfoxide solution that was 0.1M in Eu(NO$_3$)$_3$, 0.27M in Ba(NO$_3$)$_2$, and 0.051M in Cu(OCOCH$_3$)$_2$. A constant potential of $-5.0$V versus the Ag/Ag$^+$ electrode was applied to the platinum electrode and a deposit formed on the platinum electrode. After 11 coulombs/cm$^2$ had passed, the platinum electrode was removed, rinsed in fresh DMSO and dried. A portion of the deposition was shown by electrode microprobe analysis to be composed of Eu, Ba, and Cu in the approximate ratio 1-2-3. A second equivalent portion was heated to about 900° C. for about 15 min in an atmosphere of dry oxygen to yield a gray-black film in place of the deposited metals. This film exhibited an x-ray diffraction pattern identical to that of previously synthesized superconducting ceramic EuBa$_2$Cu$_3$O$_{7+x}$ (FIG. 1). In FIG. 1 all of the peaks can be assigned to either the 1-2-3 phase (shown for EuBa$_2$Cu$_3$O$_{7+x}$) or to the impurity phases Eu$_2$BaCuO$_5$ (known as the "green phase") and copper oxide. Magnetic susceptiblity measurements of the black film indicated a superconducting transition at 60° K. (FIG. 2).

EXAMPLE II

Figure 3:
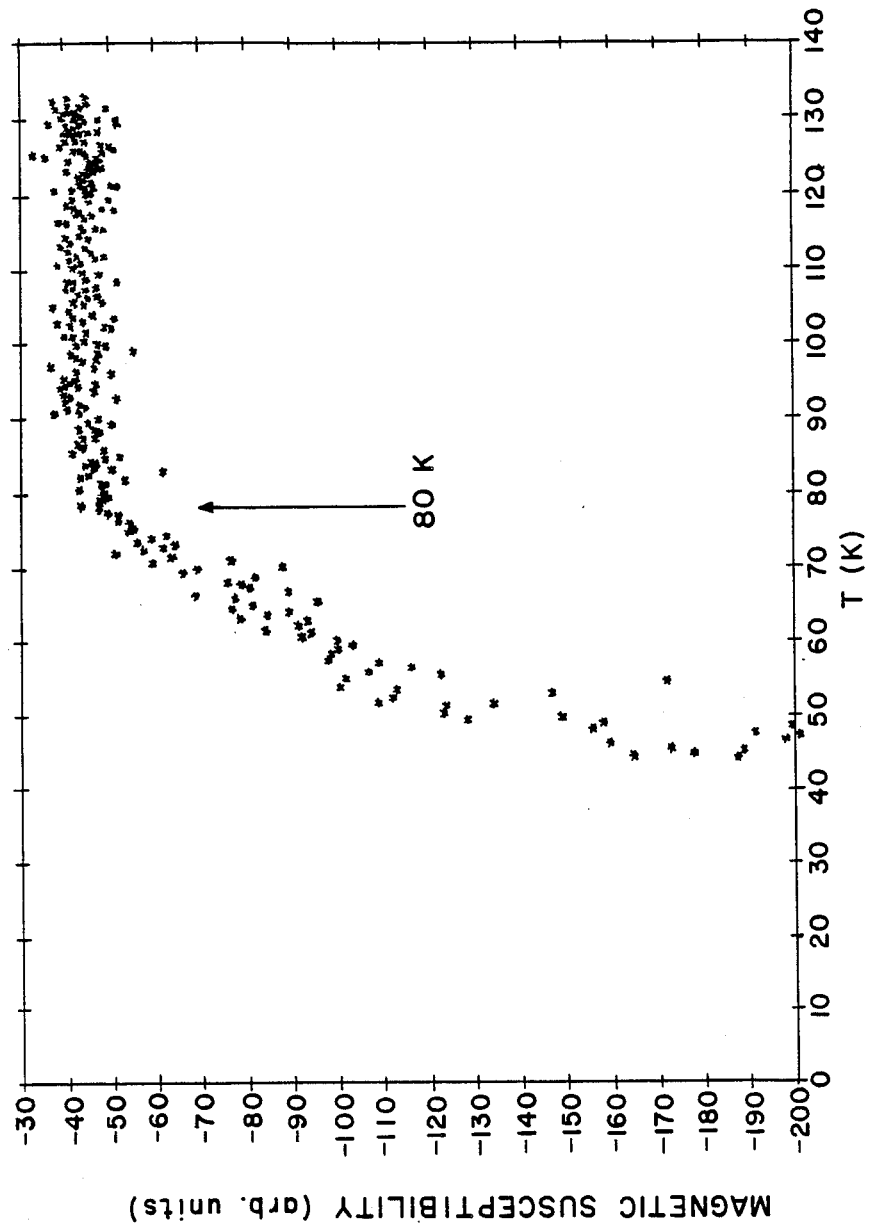
FIG. 3 is a magnetic susceptibility graph as a function of temperature of the oxidized Bi, Sr, Ca and Cu-containing film of Example II herein.

Bismuth, strontium, calcium and copper were codeposited onto a platinum foil electrode in a ratio of 0.2-0.2-1-2 following the procedure outlined in Example I. Ten coulombs were passed while a potential of $-4$V vs a Ag/Ag$^+$ reference electrode was applied to the platinum electrode while the substrate was immersed in a DMSO solution of 0.02M Bi(NO$_3$)$_3$, 0.1M Sr(NO$_3$)$_2$, 0.092M Ca(NO$_3$)$_2$, and 0.025M Cu(OCOCH$_3$)$_2$. A smooth film comprised of tightly packed micro spheres resulted, each sphere consisting of the four elements. The film was then oxidized to the superconducting ceramic by heating in a dry oxygen atmosphere at 850° C. for 15 minutes. Magnetic susceptibility measurements of the oxidized film on Pt indicated a superconducting transition at 80° K. (FIG. 3).

EXAMPLE III

Yttrium, barium and copper were codeposited by electrodeposition onto a platinum foil electrode in a ratio of 1:2:3. The platinum foil electrode and a copper counter electrode were immersed in a dimethyl-sulfoxide (DMSO) solution of 0.21M Y(NO$_3$)$_3$, 0.057M Ba(NO$_3$)$_2$, and 0.001M Cu(OAc)$_2$. A constant potential of $-4.0$V to $-5.0$V, as compared to a silver wire reference electrode, was applied to the platinum foil electrode and a deposit was formed on the platinum electrode. After 10 coulombs/cm$^2$ had passed (approximately 20 minutes), the platinum electrode was removed, rinsed in fresh DMSO and dried and analyzed by the electron microprobe technique. The analysis indicated that the deposit consisted of Y, Ba and Cu in the ratio of roughly 1:2:3. The electrode thereafter was heated to about 900° C. for about 5 minutes to yield a black film in place of the deposited metals. The black film exhibited an x-ray diffraction pattern identical to that of the previously prior art synthesized superconducting ceramic $YBa_2Cu_3O_{7-x}$.

EXAMPLE IV

Yttrium, barium, and copper were codeposited in different ratios, onto conductive indium-tin oxide films supported on quartz, from DMSO electrolytes having different relative concentrations of $Y(NO_3)_3$, $Ba(NO_3)_2$, and $Cu(OCOCH_3)_2$. In each case, the total ion concentration was about 0.05 to about 0.1M, the potential applied to the substrate was $-5V$ versus $Ag/Ag^+$, and about 2 to about 10 coulombs were passed during electrodeposition. After each deposition, the composition of the deposit was determined by electron microprobe analysis. Representative electrolytes and compositions of their resulting deposits are shown below.

| Electrolyte | | | Composite | | |
|---|---|---|---|---|---|
| $Y^{+3}$ | $Ba^{+2}$ | $Cu^{+2}$ | Y | Ba | Cu |
| 1 | 2 | 1 | 1 | 1.1 | 9.7 |
| 1 | 2 | 0.5 | 1 | 1.4 | 3.1 |
| 1 | 2.8 | 0.5 | 1 | 1.8 | 3.4 |

EXAMPLE V

Europium, barium, and copper were codeposited in a molar ratio of about 1-2-3 onto the interior surfaces of cylindrical copper tubes having internal diameters of 2, 4, and 6 mm. Each tube was fitted with a copper wire counter electrode held in the axial position of the tube by a porous separator of hydrophylic polypropylene (Celgard ). After filling each tube with the electrolyte of Example I, a potential of $-5V$ versus its copper counter electrode was applied to the tube. In each case, a continuous film covering the internal surfaces of the tubes were formed. Samples of the films scraped from the tubes were shown by microprobe analysis to contain Eu, Ba, and Cu in a ratio of about 1-2-3.

EXAMPLE VI

Bismuth, strontium, calcium, and copper were codeposited onto carbon mat in a ratio of about 0.2-0.2-1-2 following the procedure of Example II except that about 100 coulombs per $cm^2$ were passed during electrolysis. A film of the electrodeposited metals covered the carbon fibers. Oxidation of the coated carbon mat by heating at 850° C. for 15 minutes substantially removed the carbon fibers leaving behind a continuous network of ceramic fibers.

EXAMPLE VII

Selected area electrochemical deposition of the superconductor precursor alloys is accomplished by modifying conventional lithographic techniques which are conventionally employed to form circuits of metallic and semiconducting elements. An insulating photoresist is deposited by either solution or gas deposition on the platinum electrode substrate. A positive photoresist is made insoluble by selected area irradiation, so that the substrate conducting electrode is later revealing (after solvent or thermal treatment) in those regions of the electrode where the photoresist has not been irradiated. Thereafter, the electrode is electro-deposited as in Example I and only those regions, i.e., the non-irradiated regions of the electrode which are not insulating, undergo deposition of the alloy or metals upon electroplating. Upon subsequent electroplating, the superconductor precursor alloy forms only on the portions of the electrode where the insulating layer of photoresist has been removed. Thereafter, the oxidation is conducted in accordance with Example I.

EXAMPLE VIII

A metal alloy composition which is precursor to the superconductor of Example I, is electrochemically deposited in a patterned form on an electrode using photo-induced enhancement of electrochemical deposition. The photon source is a high energy laser which is scanned across the electrode surface to generate the patterned alloy deposition. The selected photon frequency, electrolyte, electrode potential and target electrode surface is varied to control the rate of the photo-enhanced electro-chemical deposition to a predetermined value. Thereafter high temperature oxidation, i.e., at about 900° C., and thermal annealing, at about 650° C. is employed to transform the patterned alloy deposition into a patterned superconductor film.

EXAMPLE IX

The method of Example V is modified to generate parallel superconducting wires having separations comparable with the wavelength of the light employed in the photo deposition. The approach utilizes alternating stripes of intense light and near zero light intensity resulting from the interference of two light beams appropriately positioned. The patterned illumination generates, through selected area photo-enhancement of current flow, the patterned deposition of superconductor precursor alloys. The oxidation of the thereby obtained precursor alloy wires provides oriented growth of the superconductor during oxidation as a consequence of the shape anisotropy of the precursor alloy. This preferred growth improves the properties of the superconductor with the oxidation being accomplished, into the superconducting state, in accordance with the method of Example I.

EXAMPLE X

Deposition of the superconductor precursor alloys on the inside of a metal tube and on the surface of a metal wire is accomplished by electrochemical techniques similar to that described in examples I and II. Thereafter the oxidation to superconducting ceramic is conducted also in accordance with the processes described in examples I and II to give a wire and the inside of a tube coated with superconducting material.

What is claimed is:

1. In a method of forming deposits of superconducting ceramics comprising the steps of (a) electrodepositing onto a substrate a mixture of metals, of the type and in proportions sufficient to be oxidized into ceramic, and (b) oxidizing said electrodeposited mixture on said substrate, under conditions sufficient to result in a superconducting ceramic deposit, the improvement wherein the electrodepositing step is conducted in a manner such that a patterned deposit results, with said oxidation step being conducted on said patterned deposit to result in a patterned superconducting deposit.

2. A method as in claim 1 wherein patterned deposition is inconducted by lithographically depositing a photoresist in a patterned manner on said substrate, and thereafter conducting said electrodepositing step.

3. A method as in claim 2 wherein said deposited photoresist is a positive photoresist, and further comprising making said positive photoresist insoluble or nonvolatile by selective area irradiation, thereafter treating said substrate to reveal the non-irradiated regions, and thereafter conducting said electrodepositing step.

4. A method as in claim 1 wherein said electrodeposition is conducted by photoinduced enhancement.

5. A method as in claim 4 wherein said photoinduced enhancement of electrodeposition is conducted by scanning a photon source across the substrate surface to generate patterned deposition.

6. A method as in claim 5 wherein said photon source is a laser.

7. A method as in claim 1 wherein said substrate is an electrode, and said patterned deposition is conducted by the use of a patterned counter-electrode.

8. A method as in claim 1 wherein said substrate is an electrode in the form of a moving belt, and wherein said electrodeposition is conducted by passing the moving belt continuously through a bath of electroplating solution while establishing a potential between the moving belt electrode and a counter-electrode.

9. A method as in claim 1 wherein said substrate in an electrode in the form of a moving wire, and wherein said electrodeposition is conducted by passing the moving wire continuously through a bath of electroplating solution while establishing a potential between the moving wire electrode and a counter-electrode.

10. A method as in claim 1 wherein said substrate is an electrode in the form of a rotating disk or rotating cylinder, and wherein said electrodeposition is conducted by rotating the rotating disk or rotating cylinder continuously in a bath of electroplating solution while establishing a potential between the rotating disk or rotating cylinder electrode and a counter-electrode.

* * * * *

UNITED STATES PATENT AND TRADEMARK OFFICE
CERTIFICATE OF CORRECTION

PATENT NO. : 4,879,270
DATED : Nov. 7, 1989
INVENTOR(S) : MacRae Maxfield et al.

It is certified that error appears in the above-identified patent and that said Letters Patent is hereby corrected as shown below:

Title page: The third inventor reads: "Zafar Igbal"; should read -- Zafar Iqbal --.

Col. 5, line 44: "configured" should read -- confined --.

line 52: "composition" should read -- compositions --.

Col. 8, line 15: "inhancement" should read -- enhancement --.

Col. 10, line 10: After "limiting", insert -- in --.

line 61: "0.21M" should read -- 0.021M --.

Col. 13, line 2: "inconducted" should read -- conducted --.

Signed and Sealed this

Twenty-fourth Day of September, 1991

Attest:

HARRY F. MANBECK, JR.

Attesting Officer

Commissioner of Patents and Trademarks